United States Patent
Park (10) Patent No.: US 9,029,927 B2
(45) Date of Patent: May 12, 2015

(54) SPIN TRANSISTOR, AND SEMICONDUCTOR DEVICE, MEMORY DEVICE, MICROPROCESSOR, PROCESSOR, SYSTEM, DATA STORAGE SYSTEM AND MEMORY SYSTEM INCLUDING THE SPIN TRANSISTOR

(71) Applicant: SK Hynix Inc., Gyeonggi-do (KR)

(72) Inventor: Ji-Ho Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/971,983

(22) Filed: Aug. 21, 2013

(65) Prior Publication Data

US 2014/0332870 A1 Nov. 13, 2014

(30) Foreign Application Priority Data

May 13, 2013 (KR) .................. 10-2013-0053728

(51) Int. Cl.
| | | |
|---|---|---|
| H01L 29/78 | (2006.01) | |
| H01L 43/00 | (2006.01) | |
| H01L 29/45 | (2006.01) | |
| H01L 29/66 | (2006.01) | |

(52) U.S. Cl.
CPC .......... *H01L 29/45* (2013.01); *H01L 29/66984* (2013.01); *H01L 29/78* (2013.01)

(58) Field of Classification Search
CPC .................. H01L 29/66984; H01L 29/45
USPC ................................. 257/332, 421
See application file for complete search history.

(56) References Cited

U.S. PATENT DOCUMENTS

| | | | | |
|---|---|---|---|---|
| 5,920,090 A | * | 7/1999 | Stenberg ................... | 257/252 |
| 6,753,562 B1 | * | 6/2004 | Hsu et al. .................. | 257/295 |
| 7,397,071 B2 | * | 7/2008 | Sugahara et al. ........... | 257/213 |
| 7,411,235 B2 | * | 8/2008 | Saito et al. ................ | 257/295 |
| 7,528,058 B2 | * | 5/2009 | Mantl et al. ............... | 438/554 |
| 7,528,428 B2 | * | 5/2009 | Sugahara et al. ........... | 257/295 |
| 7,608,901 B2 | * | 10/2009 | Koo et al. ................. | 257/421 |
| 7,652,315 B2 | * | 1/2010 | Saito et al. ................ | 257/295 |
| 7,675,103 B2 | * | 3/2010 | Koo et al. ................. | 257/295 |
| 7,709,867 B2 | * | 5/2010 | Ishikawa et al. ........... | 257/289 |
| 7,714,400 B2 | * | 5/2010 | Sugahara et al. ........... | 257/421 |
| 7,796,423 B2 | * | 9/2010 | Sugiyama et al. .......... | 365/158 |
| 7,936,028 B2 | * | 5/2011 | Hong et al. ............... | 257/421 |
| 7,943,974 B2 | * | 5/2011 | Ishikawa et al. ........... | 257/289 |
| 7,994,555 B2 | * | 8/2011 | Koo et al. ................. | 257/295 |
| 8,004,029 B2 | * | 8/2011 | Saito et al. ................ | 257/295 |

(Continued)

FOREIGN PATENT DOCUMENTS

| | | | |
|---|---|---|---|
| JP | 2008166689 A | * | 7/2008 |
| KR | 1020000015244 | | 3/2000 |

(Continued)

*Primary Examiner* — Earl Taylor
(74) *Attorney, Agent, or Firm* — IP & T Group LLP (57) ABSTRACT

A spin transistor includes a source electrode, including a magnetic material, is disposed in a substrate. A drain electrode, including a magnetic material is disposed in the substrate and is spaced apart from the source electrode in a first direction. A gate electrode is interposed between the source electrode and the drain electrode, and extends from the substrate in a second direction substantially perpendicular to the first direction. A channel layer extends along the gate electrode, and connects to the source electrode and the drain electrode.

17 Claims, 8 Drawing Sheets

(56) References Cited

U.S. PATENT DOCUMENTS

| | | | |
|---|---|---|---|
| 8,026,561 B2 * | 9/2011 | Saito et al. | 257/421 |
| 8,053,851 B2 * | 11/2011 | Koo et al. | 257/421 |
| 8,066,855 B2 * | 11/2011 | Suh et al. | 204/193 |
| 8,080,149 B2 * | 12/2011 | Suh et al. | 205/688 |
| 8,083,909 B2 * | 12/2011 | Suh et al. | 204/193 |
| 8,101,061 B2 * | 1/2012 | Suh et al. | 205/688 |
| 8,125,247 B2 * | 2/2012 | Koo et al. | 326/100 |
| 8,183,611 B2 * | 5/2012 | Kim et al. | 257/295 |
| 8,264,024 B2 * | 9/2012 | Saito et al. | 257/295 |
| 8,269,293 B2 * | 9/2012 | Hong et al. | 257/421 |
| 8,294,489 B2 * | 10/2012 | Tanamoto et al. | 326/41 |
| 8,576,601 B2 * | 11/2013 | Marukame et al. | 365/50 |
| 2005/0282379 A1 * | 12/2005 | Saito et al. | 438/624 |
| 2006/0118839 A1 * | 6/2006 | Sugahara et al. | 257/295 |
| 2006/0138502 A1 * | 6/2006 | Sugahara et al. | 257/295 |
| 2007/0155025 A1 * | 7/2007 | Zhang et al. | 438/3 |
| 2007/0201268 A1 * | 8/2007 | Johnson | 365/171 |
| 2008/0169492 A1 * | 7/2008 | Koo et al. | 257/295 |
| 2008/0283888 A1 * | 11/2008 | Saito et al. | 257/295 |
| 2008/0308844 A1 * | 12/2008 | Koo et al. | 257/192 |
| 2008/0308853 A1 * | 12/2008 | Sugahara et al. | 257/295 |
| 2009/0050948 A1 * | 2/2009 | Ishikawa et al. | 257/295 |
| 2009/0121267 A1 * | 5/2009 | Hong et al. | 257/295 |
| 2010/0073025 A1 * | 3/2010 | Tanamoto et al. | 326/41 |
| 2010/0090262 A1 * | 4/2010 | Saito et al. | 257/295 |
| 2010/0171158 A1 * | 7/2010 | Sugahara et al. | 257/295 |
| 2010/0187585 A1 * | 7/2010 | Ishikawa et al. | 257/295 |
| 2010/0271112 A1 * | 10/2010 | Hong et al. | 327/534 |
| 2011/0248325 A1 * | 10/2011 | Saito et al. | 257/295 |
| 2011/0279146 A1 * | 11/2011 | Koo et al. | 326/100 |
| 2012/0019283 A1 * | 1/2012 | Saito et al. | 326/38 |
| 2012/0218802 A1 * | 8/2012 | Marukame et al. | 365/50 |
| 2013/0140606 A1 * | 6/2013 | Koo et al. | 257/195 |

FOREIGN PATENT DOCUMENTS

| | | | |
|---|---|---|---|
| KR | 1020060094159 | 8/2006 | |
| WO | WO 2009061108 A2 * | 5/2009 | H01F 10/193 |

* cited by examiner

SPIN TRANSISTOR, AND SEMICONDUCTOR DEVICE, MEMORY DEVICE, MICROPROCESSOR, PROCESSOR, SYSTEM, DATA STORAGE SYSTEM AND MEMORY SYSTEM INCLUDING THE SPIN TRANSISTOR

CROSS-REFERENCE TO RELATED APPLICATION

The present application claims priority of Korean Patent Application No. 10-2013-0053728, filed on May 13, 2013, which is incorporated herein by reference in its entirety.

BACKGROUND

1. Field

Exemplary implementations relate to a semiconductor device, a memory device, a microprocessor, a processor, a system, a data storage system and a memory system, and more particularly, to a semiconductor device, a memory device, a microprocessor, a processor, a system, a data storage system and a memory system including a spin transistor.

2. Description of the Related Art

Currently, most semiconductor devices, from various processors for processing information to memory devices for storing the information, such as a Dynamic Random Access Memory (DRAM), Flash memory, or the like, are based on a Metal-Oxide Semiconductor Field-Effect Transistor (MOSFET). Due to physical limitations of a MOSFET, it is difficult to reduce a size and power consumption of a MOSFET or to improve an operating speed of a MOSFET.

In recent years, a spin transistor has been proposed to perform an on/off switching operation by controlling a spin direction as well as charges of electrons.

SUMMARY

Various exemplary implementations are directed to a spin transistor capable of improving a switching characteristic by securing a length of a channel layer in which electron is sufficient to perform a spin precession while reducing a size thereof.

In an exemplary implementation, a spin transistor may include a source electrode, including a magnetic material, disposed in a substrate; a drain electrode, including a magnetic material, disposed in the substrate, the drain being spaced apart from the source electrode in a first direction; a gate electrode interposed between the source electrode and the drain electrode, and extending from the substrate in a second direction substantially perpendicular to the first direction; and a channel layer extending along the gate electrode, and connecting to the source electrode and the drain electrode In an exemplary implementation, a semiconductor device may include a switching device connected between a first terminal and a second terminal to electrically couple/separate the first terminal to/from the second terminal, wherein the switching device comprises a source electrode, including a magnetic material, disposed in a substrate; a drain electrode, including a magnetic material, disposed in the substrate, the drain being spaced apart from the source electrode in a first direction; a gate electrode interposed between the source electrode and the drain electrode, and extending from the substrate in a second direction substantially perpendicular to the first direction; and a channel layer extending along the gate electrode, and connecting to the source electrode and the drain electrode.

In an exemplary implementation, a memory device may include a source electrode, including a magnetic material, disposed in a substrate; a drain electrode, including a magnetic material, disposed in the substrate, the drain being spaced apart from the source electrode in a first direction; a gate electrode interposed between the source electrode and the drain electrode, and extending from the substrate in a second direction substantially perpendicular to the first direction; and a channel layer extending along the gate electrode, and connecting to the source electrode and the drain electrode; a source line electrically connected to the source electrode; a memory element electrically connected to the drain electrode; and a bit line electrically connected to the memory element.

In an exemplary implementation, a microprocessor may include a control unit configured to receive a signal including an external command, and to output a signal based on the external command; an operation unit configured to receive the signal outputted from the control unit, and perform an operation in response to the signal outputted from the control unit; and a memory unit configured to store data for performing the operation, data resulting for a performance of the operation, or an address of the data for performing the operation, wherein the control unit, the operation unit, or the memory unit comprise a source electrode, including a magnetic material, disposed in a substrate; a drain electrode, including a magnetic material, disposed in the substrate, the drain being spaced apart from the source electrode in a first direction; a gate electrode interposed between the source electrode and the drain electrode, and extending from the substrate in a second direction substantially perpendicular to the first direction; and a channel layer extending along the gate electrode, and connecting to the source electrode and the drain electrode.

In an exemplary implementation, a processor may include a core unit configured to perform, in response to an external command, an operation corresponding to the external command, by using data; a cache memory unit configured to data for performing the operation, data resulting for a performance of the operation, or an address of the data for performing the operation; and a bus interface, connected between the core unit and the cache memory unit, and configured to communicate data between the core unit and the cache memory unit, wherein at least one of the core unit and the cache memory unit comprises a source electrode, including a magnetic material, disposed in a substrate; a drain electrode, including a magnetic material, disposed in the substrate, the drain being spaced apart from the source electrode in a first direction; a gate electrode interposed between the source electrode and the drain electrode, and extending from the substrate in a second direction substantially perpendicular to the first direction; and a channel layer extending along the gate electrode, and connecting to the source electrode and the drain electrode.

In an exemplary implementation, a system may include a processor configured to receive an external command or external information, and control an operation of the system based on the decoded command; an auxiliary memory device configured to store a program to process the external command or the external information; a main memory device configured to receive and store the program and the external information from the auxiliary memory device, wherein the processor can access the program and the external information, when performing the operation; and an interface device configured to communicate between an external device and the processor, the auxiliary memory device, or the main memory device, wherein the processor, the auxiliary memory device, or the main memory device comprises a source electrode, including a magnetic material, disposed in a substrate; a drain electrode, including a magnetic material, disposed in the substrate, the drain being spaced apart from the source electrode in a first direction; a gate electrode interposed between the source electrode and the drain electrode, and extending from the substrate in a second direction substantially perpendicular to the first direction; and a channel layer extending along the gate electrode, and connecting to the source electrode and the drain electrode.

In an exemplary implementation, a data storage system may include a storage device configured to non-volatily store data; a controller configured to control, in response to an external command, an input of data to the storage device or an output of data from the storage device; a temporary storage device configured to temporarily store the data to be inputted to the storage device or the data outputted from the storage device; and an interface configured to communicate between an external device and the storage device, the controller, or the temporary storage device, wherein the storage device, the controller, or the temporary storage device comprises a source electrode, including a magnetic material, disposed in a substrate; a drain electrode, including a magnetic material disposed in the substrate, the drain being spaced apart from the source electrode in a first direction; a gate electrode interposed between the source electrode and the drain electrode, and extending from the substrate in a second direction substantially perpendicular to the first direction; and a channel layer extending along the gate electrode, and connecting to the source electrode and the drain electrode.

In an exemplary implementation, a memory system may include a memory configured to non-volatily store data; a memory controller configured to control, in response to an external command, an input of data to the memory or an output of data from the memory; a buffer memory configured to buffer the data to be inputted to the memory or the data outputted from the memory; and an interface configured to communicate between an external device and the memory, the memory controller, or the buffer memory, wherein the memory, the memory controller, or the buffer memory comprises a source electrode, including a magnetic material, disposed in a substrate; a drain electrode, including a magnetic material, disposed in the substrate, the drain being spaced apart from the source electrode in a first direction; a gate electrode interposed between the source electrode and the drain electrode, and extending from the substrate in a second direction substantially perpendicular to the first direction; and a channel layer extending along the gate electrode and connecting to the source electrode and the drain electrode.

In an exemplary implementation, a microprocessor may include a control unit configured to receive a signal including an external command, and to output a signal based on the external command; an operation unit configured to receive the signal outputted from the control unit, and perform an operation in response to the signal outputted from the control unit; and a memory unit configured to store data for performing the operation, data resulting for a performance of the operation, or an address of the data for performing the operation, wherein the control unit, the operation unit, or the memory unit comprise: a source electrode, including a magnetic material, disposed in a substrate; a drain electrode, including a magnetic material, disposed in the substrate, the drain being spaced apart from the source electrode in a first direction; a gate electrode interposed between the source electrode and the drain electrode, and extending from the substrate in a second direction substantially perpendicular to the first direction; and a channel layer extending along the gate electrode, and connecting to the source electrode and the drain electrode.

In an exemplary implementation, a processor may include a core unit configured to perform, in response to an external command, an operation corresponding to the external command, by using data; a cache memory unit configured to data for performing the operation, data resulting for a performance of the operation, or an address of the data for performing the operation; and a bus interface, connected between the core unit and the cache memory unit, and configured to communicate data between the core unit and the cache memory unit wherein at least one of the core unit and the cache memory unit comprises: a source electrode, including a magnetic material, disposed in a substrate; a drain electrode, including a magnetic material, disposed in the substrate, the drain being spaced apart from the source electrode in a first direction; a gate electrode interposed between the source electrode and the drain electrode, and extending from the substrate in a second direction substantially perpendicular to the first direction; and a channel layer extending along the gate electrode, and connecting to the source electrode and the drain electrode.

In an exemplary implementation, a system may include a processor configured to receive an external command or external information, and control an operation of the system based on the decoded command; an auxiliary memory device configured to store a program to process the external command or the external information; a main memory device configured to receive and store the program and the external information from the auxiliary memory device, wherein the processor can access the program and the external information, when performing the operation; and an interface device configured to communicate between an external device and the processor, the auxiliary memory device, or the main memory device, wherein the processor, the auxiliary memory device, or the main memory device comprises: a source electrode, including a magnetic material, disposed in a substrate; a drain electrode, including a magnetic material disposed in the substrate, the drain being spaced apart from the source electrode in a first direction; a gate electrode interposed between the source electrode and the drain electrode, and extending from the substrate in a second direction substantially perpendicular to the first direction; and a channel layer extending along the gate electrode, and connecting to the source electrode and the drain electrode.

In an exemplary implementation, a data storage system comprising: a storage device configured to non-volatily store data; a controller configured to control, in response to an external command, an input of data to the storage device or an output of data from the storage device; a temporary storage device configured to temporarily store the data to be inputted to the storage device or the data outputted from the storage device; and an interface configured to communicate between an external device and the storage device, the controller, or the temporary storage device, wherein the storage device, the controller, or the temporary storage device comprises: a source electrode, including a magnetic material, disposed in a substrate; a drain electrode, including a magnetic material, disposed in the substrate, the drain being spaced apart from the source electrode in a first direction; a gate electrode interposed between the source electrode and the drain electrode, and extending from the substrate in a second direction substantially perpendicular to the first direction; and a channel layer extending along the gate electrode, and connecting to the source electrode and the drain electrode.

In an exemplary implementation, a memory system comprising: a memory configured to non-volatile store data; a memory controller configured to control, in response to an external command, an input of data to the memory or an output of data from the memory; a buffer memory configured to buffer the data to be inputted to the memory or the data outputted from the memory; and an interface configured to communicate between an external device and the memory, the memory controller, or the buffer memory, wherein the memory, the memory controller, or the buffer memory comprises: a source electrode, including a magnetic material, disposed in a substrate; a drain electrode, including a magnetic material, disposed in the substrate, the drain being spaced apart from the source electrode in a first direction; a gate electrode interposed between the source electrode and the drain electrode, and extending from the substrate in a second direction substantially perpendicular to the first direction; and a channel layer extending along the gate electrode, and connecting to the source electrode and the drain electrode.

DETAILED DESCRIPTION

Various exemplary implementations will be described below in more detail with reference to the accompanying drawings. Exemplary implementations may, however, be present in different forms and should not be construed as limited to those set forth herein. Throughout the disclosure, reference numerals correspond directly to the like numbered parts in the various figures and exemplary implementations of the present invention.

The drawings are not necessarily correct in scale and, in some instances, proportions may have been exaggerated in order to clearly illustrate features of the exemplary implementations. When a first layer is referred to as being "on" a second layer or "on" a substrate, it not only refers to a case where the first layer is formed directly on the second layer or the substrate but also a case where a third layer exists between the first layer and the second layer or the substrate.

Figure 1A:
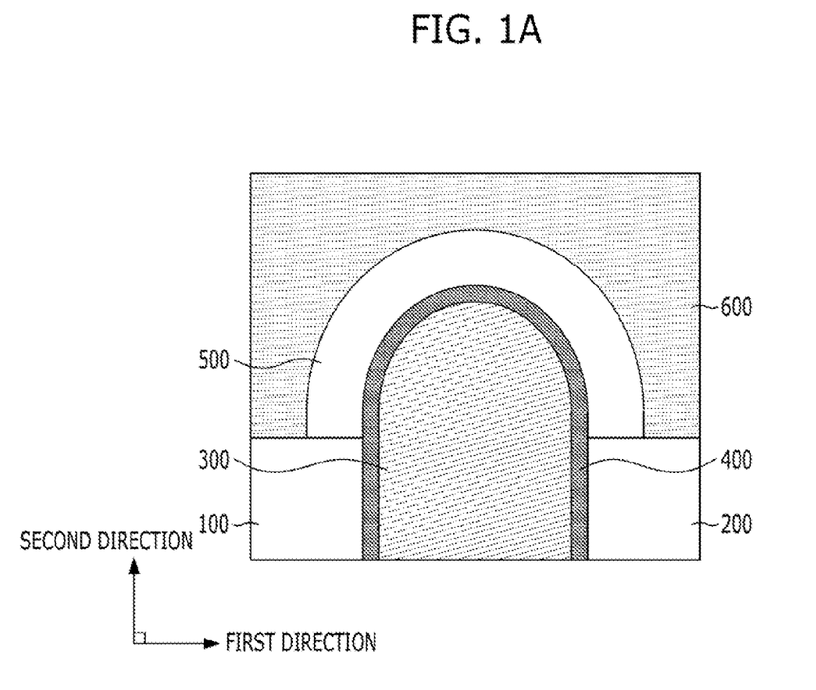
FIGS. 1A and 1B are cross-sectional views showing spin transistor in accordance with a first exemplary implementation.
Figure 1B:
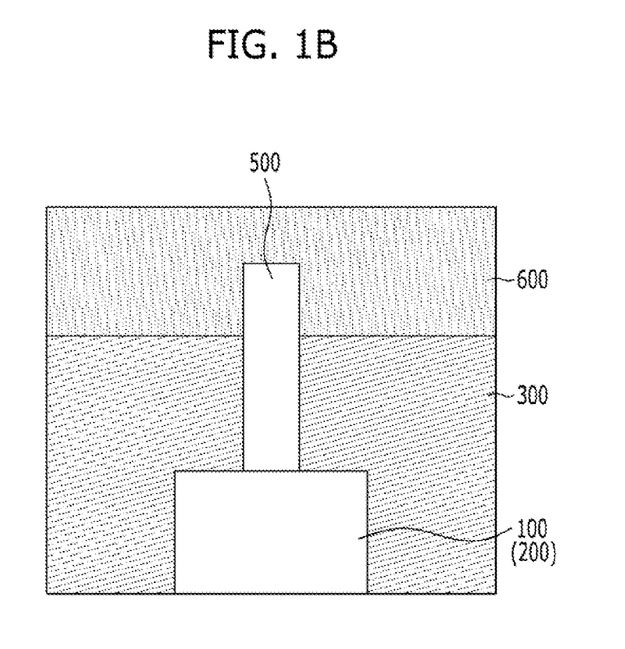

FIGS. 1A and 1B are cross-sectional views showing a spin transistor in accordance with a first exemplary implementation. FIG. 1A shows a cross-sectional view in the direction of a longitudinal section of a channel layer, and FIG. 16 shows a cross-sectional view in the direction of a width section of the channel layer.

Referring to FIGS. 1A and 1B, the spin transistor in accordance with the first exemplary implementation includes a source electrode 100, a drain electrode 200, a gate electrode 300, and a channel layer 500. The source electrode 100 is disposed in a substrate (not shown), and includes a magnetic material. The drain electrode 200 is disposed in the substrate (not shown), spaced apart from the source electrode 100 in a first direction, and includes a magnetic material. The gate electrode 300 is interposed between the source electrode 100 and the drain electrode 200, and protrudes from the substrate (not shown) in a second direction substantially perpendicular to the first direction. The channel layer 500 extends along the gate electrode 300, and is connected to the source electrode 100 and the drain electrode 200. Further, a gate dielectric layer 400 may be interposed between the source electrode 100 and the gate electrode 300 between the drain electrode 200 and the gate electrode 300, and between the channel layer 500 and the gate electrode 300. An insulation layer 600 may be formed over a top surface of the spin transistor in accordance with the first exemplary implementation.

The source electrode 100 may serve to inject spin-polarized electrons to the channel layer 500, and the drain electrode 200 may serve to detect spins of the electrons passing through the channel layer 500. The source electrode 100 and the drain electrode 200 may be magnetized in the first direction, or in a direction opposite to the first direction. Here, the first direction is horizontal to the direction of a longitudinal section of the channel layer 500. The source electrode 100 and the drain electrode 200 may be magnetized in the second direction, or in a direction opposite to the second direction. Here, the second direction is perpendicular to the direction of a longitudinal section of the channel layer 500. Meanwhile, magnetization directions of the source electrode 100 and the drain electrode 200 may be parallel or anti-parallel to each other.

Further, the source electrode 100 and the drain electrode 200 may include, for example, a ferromagnetic material, such as iron (Fe), nickel (Ni), cobalt (Co) gadolinium (Gd), dysprosium (Dy), or the like, or an alloy thereof, such as cobalt iron (CoFe), nickel iron (NiFe), cobalt iron nickel (CoFeNi), or the like. To improve a magnetic property of the source electrode 100 and the drain electrode 200, various elements may be added to the ferromagnetic material or alloy thereof. For example, the source electrode 100 and the drain electrode 200 may include cobalt iron boron (CoFeB), formed by adding boron (B) to CoFe. As well as boron (B), one or more from among tantalum (Ta), ruthenium (Ru), copper (Cu), gold (Au), titanium (Ti), chromium (Cr), silver (Ag), aluminum (Al), osmium (Os), rhenium (Re), carbon (C), oxide (O), nitride (N), palladium (Pd), platinum (Pt), zirconium (Zr), zinc (Zn), iridium (Ir), tungsten (W), molybdenum (Mo), or niobium (Nb) may be added to the ferromagnetic material or alloy thereof. Further, the source electrode 100 and the drain electrode 200 may include a magnetic semiconductor, such as gallium arsenide (GaAs), manganese arsenide (MnAs), indium arsenide (InAs), gallium manganese arsenide (GaMnAs), indium manganese arsenide (InMnAs), or the like. Meanwhile, the source electrode 100 and the drain electrode 200 may be formed of same material, or of different materials.

The gate electrode 300 may be formed over the substrate, or disposed in the substrate, and may serve to control spin directions of electrons passing through the channel layer 500. The gate electrode 300 may extend a specific direction. Particularly, an upper side of the gate electrode 300 may protrude to have a curved surface. The gate electrode 300 may include a conductive material, for example, a metal, such as tungsten (W), aluminum (Al), copper (Cu), gold (Au), silver (Ag), platinum (Pt), nickel (Ni), chromium (Cr), cobalt (Co), titanium (Ti) ruthenium (Ru), hafnium (Hf), zirconium (Zr), or the like, a metal nitride, such as a titanium nitride (TiN), a tantalum nitride (TaN), tungsten nitride (WN), or the like, or a doped silicon.

The channel layer 500 may serve as a passage for the spin-polarized electrons, and be formed over an upper portion of the gate electrode 300. Particularly, the channel layer 500 may have an arch shape. A length of the channel layer 500 may be longer than a distance between the source electrode 100 and the drain electrode 200. Accordingly, the channel layer 500 has a length sufficient to perform a spin precession while reducing a size of the spin transistor. Meanwhile, the channel layer 500 may include a semiconductor material, such as silicon (Si), germanium (Ge), or the like, or a semi-metal magnetic material, such as a Heusler alloy, a material of double perovskite structure, a semiconductor doped with a transition metal, a magnetic oxide, or the like.

The gate dielectric layer 400 may be formed to surround the gate electrode 300, and may include one or more of silicon oxide ($SiO_2$), magnesium oxide (MgO), aluminum oxide ($Al_2O_3$), zirconium oxide ($ZrO_2$) or silicon nitride ($Si_3N_4$). Further, the gate dielectric layer 400 may include an oxide, a nitride-based material, or an insulating polymer.

Figure 2:
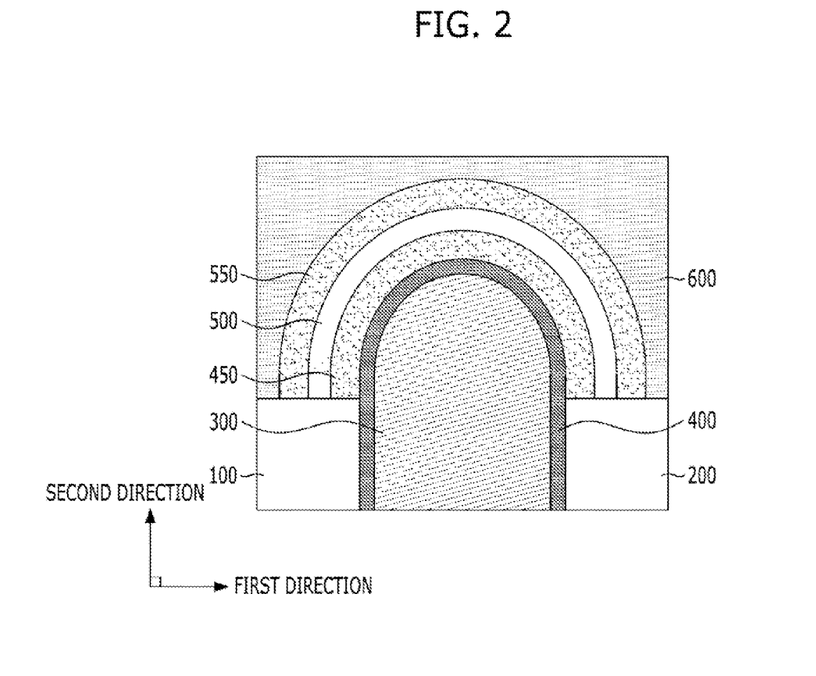
FIG. 2 is a cross-sectional view showing a spin transistor in accordance with a second exemplary implementation of the present invention.

FIG. 2 is a cross-sectional view showing a spin transistor in accordance with a second exemplary implementation. For conciseness detailed description for some configurations shown in FIG. 2, which are substantially the same as those of the first exemplary implementation shown in FIGS. 1A and 1B, will be omitted.

Referring to FIG. 2, the spin transistor in accordance with the second exemplary implementation includes a lower cladding layer 450 formed below the channel layer 500, and an upper cladding layer 550 formed over the channel layer 500. The lower cladding layer 450 and the upper cladding layer 550 may include a single layer including indium gallium arsenide (InGaAs), indium aluminum arsenide (InAlAs) or the like, or a stacked layer thereof.

Here, due to an energy barrier of the lower cladding layer 450 and the upper cladding layer 550, which are formed to surround the channel layer 500, quantum wells may be formed in the channel layer 500. As a result, a two-dimensional electron gas layer having a high electron mobility may be formed in the channel layer 500. Meanwhile, the two-dimensions (electron gas layer may include at least one selected from the group consisting of gallium arsenide (GaAs), indium arsenide (InAs), indium manganese arsenide (InGaAs), and indium antimonide (InSb).

Figure 3:
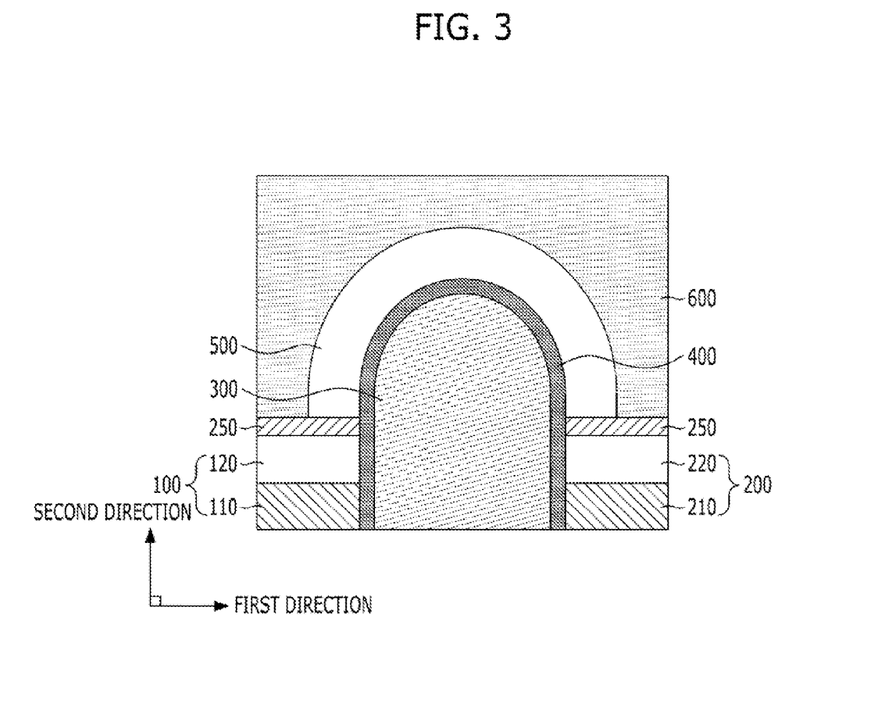
FIG. 3 is a cross-sectional view showing a spin transistor in accordance with a third exemplary implementation.

FIG. 3 is a cross-sectional view showing a spin transistor in accordance with a third exemplary implementation. For conciseness, detailed description for some configurations shown in FIG. 3, which are substantially the same as those of the first exemplary implementation shown in FIGS. 1A and 1B, will be omitted.

Referring to FIG. 3, the source electrode 100 of the spin transistor in accordance with the third exemplary implementation of the present invention includes a first anti-ferromagnetic layer 110 and a first ferromagnetic layer 120, and the drain electrode 200 includes a second anti-ferromagnetic layer 210 and a second ferromagnetic layer 220. Further, a tunnel barrier layer 250 may be interposed between the source electrode 100 and the channel layer 500, and between the drain electrode 200 and the channel layer 500. The first and second ferromagnetic layers 120 and 220 may include a ferromagnetic material, such as iron (Fe), nickel (Ni), cobalt (Co), gadolinium (Gd), dysprosium (Dy), or the like, or an alloy thereof.

Here, the first and second anti-ferromagnetic layers 110 and 210 are provided to stably fix a magnetization direction of the first and second ferromagnetic layers 120 and 220, and may include an anti-ferromagnetic material, such as platinum-manganese (PtMn), iridium manganese (IrMn), nickel-manganese (NiMn), iron-manganese (FeMn), nickel oxide (NiO), cobalt oxide (CoO), iron oxide ($Fe_2O_3$), nickel chloride ($NiCl_2$), cobalt chloride ($CoCl_2$), iron chloride ($FeCl_2$), or the like. The tunnel barrier layer 250 may include a non-magnetic insulating material, such as magnesium oxide (MgO), aluminum oxide ($Al_2O_3$), silicon oxide ($SiO_2$), bismuth oxide ($Bi_2O_3$), magnesium nitride (MgN), aluminum nitride (AlN), silicon nitride (SiN) magnesium fluoride ($MgF_2$), calcium fluoride ($CaF_2$), or the like.

Figure 4A:
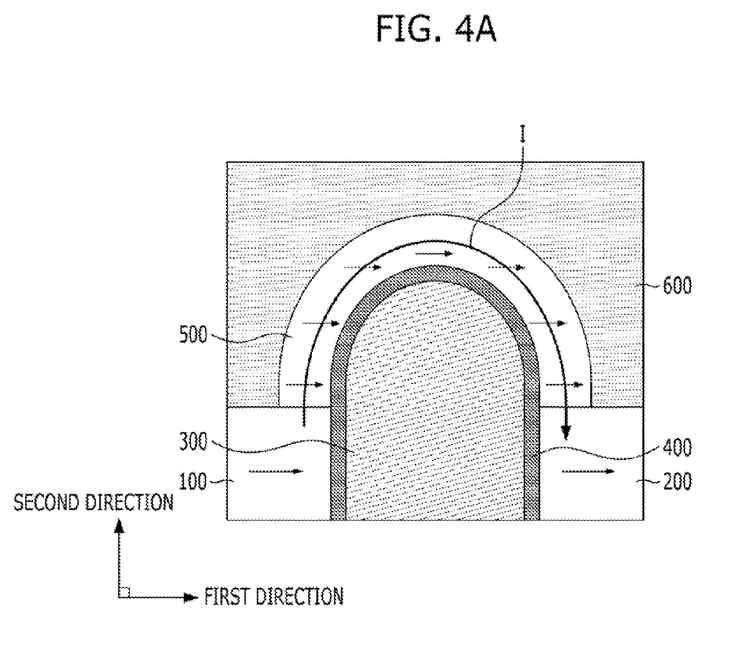
FIGS. 4A and 4B are cross-sectional views explaining a switching mechanism of a spin transistor in accordance with an exemplary implementation.
Figure 4B:
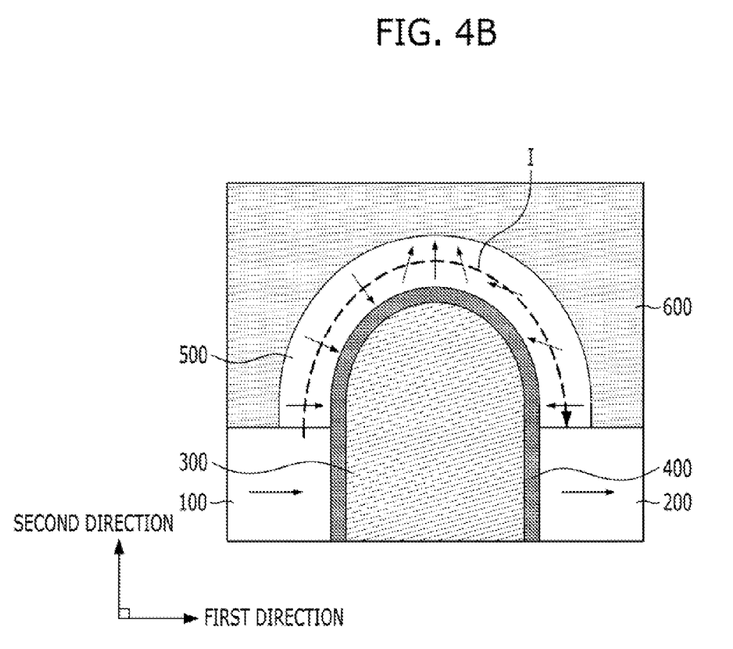

FIGS. 4A and 4B are cross-sectional views explaining a switching mechanism of a spin transistor in accordance with an exemplary implementation.

Referring to FIG. 4A, if 0V is applied to the gate electrode 300, a spin direction of the electron may become parallel to a magnetization direction of the drain electrode 200 at the moment when an electron injected to the channel layer 500 from the source electrode 100 reaches the drain electrode 200. At this time, the spin transistor is turned on, and thus, current (I) flows to the drain electrode 200 from the source electrode 100 through the channel layer 500.

Referring to FIG. 4B, if a predetermined voltage, except for 0V, is applied to the gate electrode 300, a spin direction of the electron may become anti-parallel to a magnetization direction of the drain electrode 200 at the moment when an electron injected to the channel layer 500 from the source electrode 100 reaches the drain electrode 200. At this time, the spin transistor is turned off and thus current (I) does not flow to the drain electrode 200 from the source electrode 100.

Figure 5A:
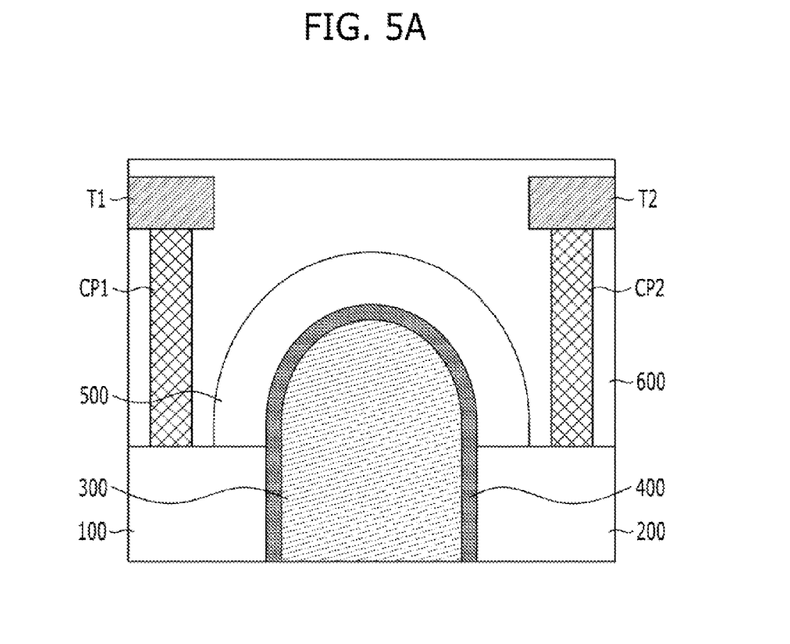
FIG. 5A is a cross-sectional view showing a semiconductor device in accordance with an exemplary implementation.
Figure 5B:
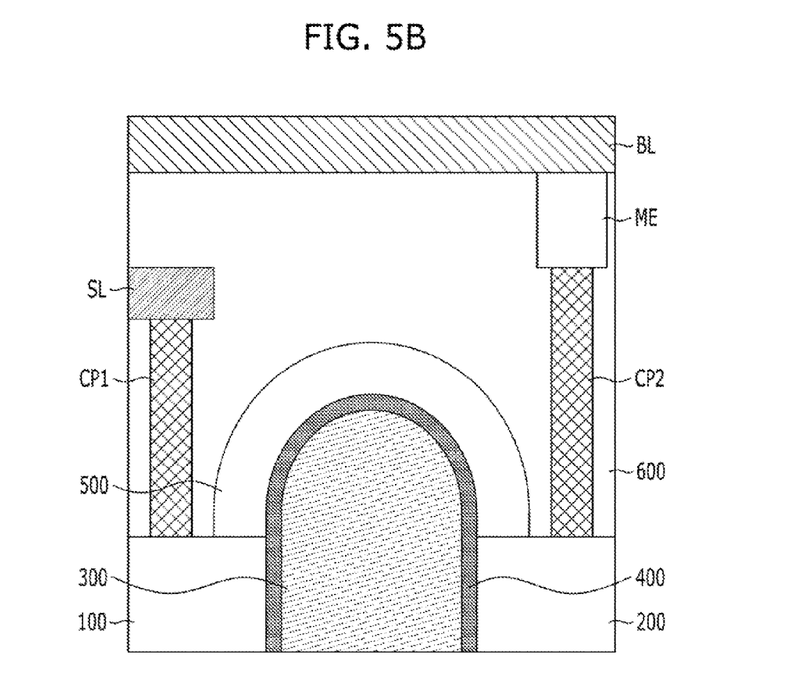
FIG. 5B is a cross-sectional view showing a memory device in accordance with an exemplary implementation.

FIG. 5A is a cross-sectional view showing a semiconductor device in accordance with an exemplary implementation, and FIG. 5B is a cross-sectional view showing a memory device in accordance with an exemplary implementation.

Referring to FIG. 5A, the semiconductor device includes a switching device that is connected between a first terminal T1 and a second terminal T2, so as to electrically couple/separate the first terminal T1 to/from the second terminal T2. The first terminal T1 and the second terminal T2 may comprise circuit elements, and be respectively connected to the switching device through contact plugs CP1 and CP2 comprising of a conductive material, such as a metal, a metal nitride, doped silicon, or the like.

Here, the switching device includes a source electrode 100 that is disposed in a substrate (not shown) and includes a magnetic material, a drain electrode 200 that is disposed in the substrate (not shown), is spaced apart from the source electrode 100 in a first direction, and includes a magnetic material, a gate electrode 300 that is interposed between the source electrode 100 and the drain electrode 200, and protrudes from the substrate (not shown) in a second direction substantially perpendicular to the first direction, a channel layer 500 that extends along the gate electrode 300, and is connected to the source electrode 100 and the drain electrode 200, and a gate dielectric layer 400 that is interposed between the source electrode 100 and the gate electrode 300, between the drain electrode 200 and the gate electrode 300, and between the channel layer 500 and the gate electrode 300. An insulation layer 600 may be formed over a top surface of the spin transistor.

Referring to FIG. 5B, the memory device includes a source electrode 100 that is disposed in a substrate (not shown) and includes a magnetic material, a drain electrode 200 that is disposed in the substrate (not shown), spaced apart from the source electrode 100 in a first direction, and includes a magnetic material, a gate electrode 300 that is interposed between the source electrode 100 and the drain electrode 200, and protrudes from the substrate (not shown) in a second direction substantially perpendicular to the first direction, a channel layer 500 that extends along the gate electrode 300, and is connected to the source electrode 100 and the drain electrode 200, a gate dielectric layer 400 that is interposed between the source electrode 100 and the gate electrode 300, between the drain electrode 200 and the gate electrode 300, and between the channel layer 500 and the gate electrode 300, a source line SL that is electrically connected to the source electrode 100, a memory element ME that is electrically connected to the drain electrode 200, and a bit line BL that is electrically connected to the memory element ME. An insulation layer 600 may be formed over a top surface of the spin transistor.

The source electrode 100 is connected to the source line SL through a first contact plug CP1, and the drain electrode 200 is connected to one terminal of the memory element ME through a second contact plug CP2. Another terminal of the memory element ME is connected to the bit line BL. The source line SL, the bit line BL, and the first and second contact plugs CP1 and CP2 may include a conductive material, such as a metal, a metal nitride, doped silicon, or the like.

Here, the memory element ME comprises a structure configured to store charges, or a structure configured to switch at least two different resistance states by varying its resistances in response to an applied voltage or current. For example, the memory element ME may include a Spin Transfer Torque (STT) structure, or a Magnetic Tunnel Junction (MTJ) structure whose resistance varies according to a magnetic field. In addition, the memory element ME may include a structure whose resistance varies based on an oxygen vacancy or an ion migration. Furthermore, the memory element ME may include a structure whose resistance varies based on a phase change of a material.

Figure 6:
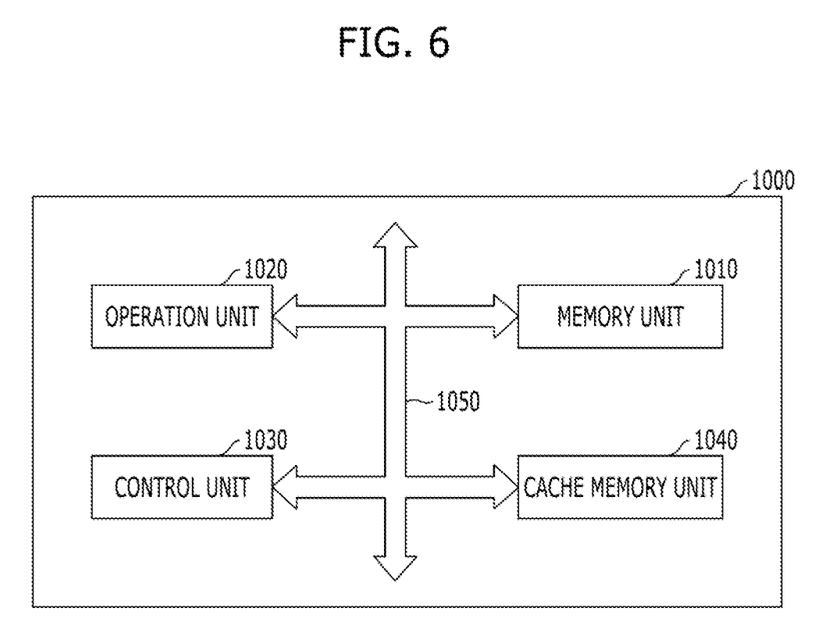
FIG. 6 is a configuration diagram of a microprocessor in accordance with an exemplary implementation.

FIG. 6 is a configuration diagram of a microprocessor in accordance with an exemplary implementation.

Referring to FIG. 6, a microprocessor 1000 may perform tasks for controlling and tuning a series of processes of receiving data from various external devices, processing the data, and outputting processing results to external devices. The microprocessor 1000 may include a memory unit 1010, an operation unit 1020 and a control unit 1030. The microprocessor 1000 may be implemented, for example, as a central processing unit (CPU), a graphic processing unit (GPU), a digital signal processor (DSP), or an application processor (AP).

The memory unit 1010 may store data in the microprocessor 1000, such as a processor register or a register. The memory unit 1010 may include a register, such as a data register, an address register, or a floating point register. The memory unit 1010 may temporarily store data an operation that is to be performed by the operation unit 1020, may store data resulting from the performance of the operation, or may store an address where data to perform the operation is stored.

The operation unit 1020 may perform an operation in the microprocessor 1000. The operation unit 1020 may perform an arithmetical operation or a logical operation based on a signal communicated from the control unit 1030. The operation unit 1020 may include at least one arithmetic logic unit (ALU).

The control unit 1030 may receive a signal from the memory unit 1010, the operation unit 1020, or an external device of the microprocessor 1000. The control unit 1030 may perform extraction and decoding commands, may perform control input and output, and may execute processing represented by a program.

At least one of the memory unit 1010, the operation unit 1020, and the control unit 1030 may include one of the above-described spin transistors in accordance with the implementations. At least one of the memory unit 1010, the operation unit 1020, and the control unit 1030 may include a source electrode which is disposed in a substrate (not shown) and includes magnetic materials, a drain electrode which is disposed in the substrate (not shown), spaced apart from the source electrode toward a first direction, and includes magnetic materials, a gate electrode which is interposed between the source electrode and the drain electrode, and protrudes from the substrate (not shown) toward a second direction crossing the first direction and a channel layer which extends along the gate electrode, and is coupled to the source electrode and the drain electrode.

The microprocessor 1000, according to an exemplary implementation, may additionally include a cache memory unit 1040 that can temporarily store data inputted from an external device or that is to be outputted to an external device. In this case, the cache memory unit 1040 may exchange data with the memory unit 1010, the operation unit 1020, or the control unit 1030 through a bus interface 1050.

Figure 7:
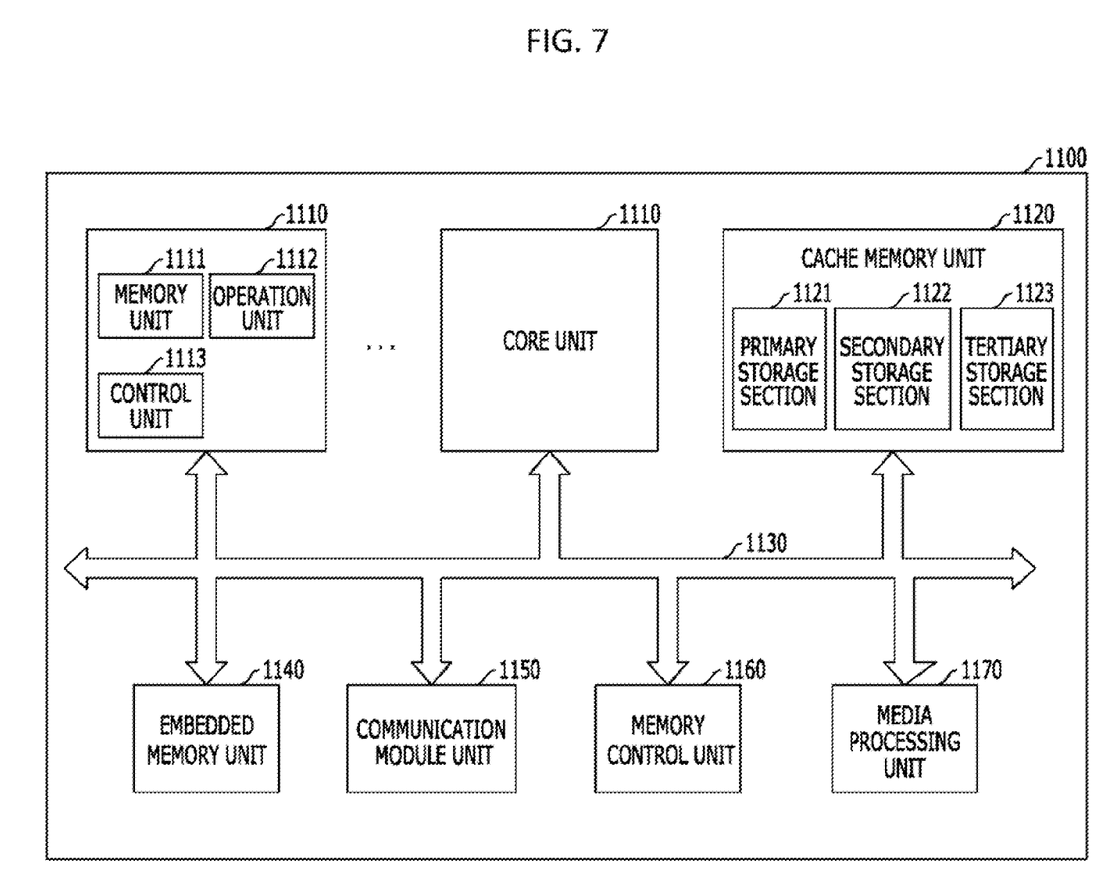
FIG. 7 is a configuration diagram of a processor in accordance with an exemplary implementation.

FIG. 7 is a configuration diagram of a processor in accordance with an exemplary implementation.

Referring to FIG. 7, processor 1100 may improve performance and realize multi-functionality by including various functions in addition to the function which is performed by a microprocessor such as controlling and tuning a series of processes of receiving data from various external devices, processing the data, and outputting processing results to external devices. The processor 1100 may include a core unit 1110, a cache memory unit 1120, and a bus interface 1130. The core unit 1110, of an exemplary implementation, may perform an arithmetic logic operation on data inputted from an external device, and may include a memory unit 1111, an operation unit 1112, or a control unit 1113. The processor 1100 may be, for example, a system-on-chips (SoCs), such as a multi-core processor, a graphic processing unit (GPU) an application processor (AP), and the like.

The memory unit 1111 may store data in the processor 1100, as a processor register or a register. The memory unit 1111 may include a register, such as a data register, an address register, or a floating point register. The memory unit 1111 may temporarily store (i) data for which an operation is to be performed by the operation unit 1112, (ii) result data obtained by performing the operation, or (iii) an address where the data for performing of the operation is stored. The operation unit 1112 may perform an operation in the processor 1100. The operation unit 1112 may perform an arithmetical operations or a logical operation based on a signal from the control unit 1113. The operation unit 1112 may include at least one arithmetic logic unit (ALU). The control unit 1113 may receive a signal from the memory unit 1111, the operation unit 1112, or an external device of the processor 1100, perform extraction and decoding commands, control input and output, and may execute processing represented by a program.

At least one of the memory unit 1111, the operation unit 1112, and the control unit 1113 of the core unit 110 may include one of the above-described exemplary spin transistors in accordance with the exemplary implementations. At least one of the memory unit 1111, the operation unit 1112, and the control unit 1113 may include a source electrode which is disposed in a substrate (not shown) and includes magnetic materials, a drain electrode which is disposed in the substrate (not shown), spaced apart from the source electrode toward a first direction, and includes magnetic materials, a gate electrode which is interposed between the source electrode and the drain electrode, and protrudes from the substrate (not shown) toward a second direction crossing the first direction, and a channel layer which extends along the gate electrode, and is coupled to the source electrode and the drain electrode.

The cache memory unit 1120 may temporarily store data to compensate for a difference in a data processing speed between the core unit 1110, which operates at a high speed, and an external device that operates at a low speed. The cache memory unit 1120 may include a primary storage section 1121, a secondary storage section 1122, or a tertiary storage section 1123. In general, the cache memory unit 1120 includes the primary and secondary storage sections 1121 and 1122 and may include the tertiary storage section 1123 in order to properly cope with a situation where high storage capacity is required. When appropriate, the cache memory unit 1120 may include an increased number of storage sections. That is to say, the number of storage sections that are included in the cache memory unit 1120 may be changed according to a design. The speeds at which the primary, secondary, and tertiary storage sections 1121, 1122 and 1123 store and discriminate data may be the same or different. In the case where the speeds of the respective storage sections 1121, 1122 and 1123 are different, the speed of the primary storage section 1121 may be set to be fastest.

At least one storage section of the primary storage section 1121, the secondary storage section 1122, and the tertiary storage section 1123, of the cache memory unit 1120, may include one of the above-described exemplary spin transistors in accordance with the exemplary implementations. The cache memory unit 1120 including the spin transistors in accordance with the aforementioned exemplary implementation may include a source electrode which is disposed in a substrate (not shown) and includes magnetic materials, a drain electrode which is disposed in the substrate (not shown), spaced apart from the source electrode toward a first direction, and includes magnetic materials, a gate electrode which is interposed between the source electrode and the drain electrode, and protrudes from the substrate (not shown) toward a second direction crossing the first direction, and a channel layer which extends along the gate electrode, and is coupled to the source electrode and the drain electrode.

The bus interface 1130 may connect the core unit 1110 and the cache memory unit 1120 and may allow data to be efficiently communicated. Although this exemplary configuration shows that the primary, secondary, and tertiary storage sections 1121, 1122 and 1123 are provided inside the cache memory unit 1120, in an alternative implementation, the primary storage sections 1121 of the cache memory unit 1120 may be provided inside the core unit 1110. To enhance data processing speed, the secondary and tertiary storage sections 1122 and 1123 may be provided outside the core unit 1110.

The processor 1100, according to an exemplary implementation, may include a plurality of core units 1110, and the plurality of core units 1110 may share the same cache memory unit 1120. The plurality of core units 1110 and the cache memory unit 1120 may be connected through the bus interface 1130. The plurality of core units 1110 may be configured in substantially the same way as the above-described configuration of the core unit 1110. In an implementation where the processor 1100 includes the plurality of core unit 1110, the primary storage section 1121 of each core unit 1110 may be configured to correspond to the number of the plurality of core units 1110, and the secondary storage section 1122 and the tertiary storage section 1123 may be configured outside the plurality of core units 1110 and may be shared through the bus interface 1130. The processing speed of the primary storage section 1121 may be faster than the processing speeds of the secondary and tertiary storage section 1122 and 1123.

The processor 1100, according to an exemplary implementation, may further include an embedded memory unit 1140 to store data, a communication module unit 1150 to communicate data to and from an external device in a wired or wireless manner, a memory control unit 1160 to drive an external memory device, or a media processing unit 1170 to process the data processed in the processor 1100 or the data inputted from an external input device and to output the processed data to an external interface device. The processor 1100 may include a plurality of modules. In this case, the plurality of modules that are added may exchange data, via the bus interface 1130, with the core units 1110, the cache memory unit 1120.

The embedded memory unit 1140 may include not only a volatile memory but also a nonvolatile memory. The volatile memory may include, for example, a dynamic random access memory (DRAM), a mobile DRAM, a static random access memory (SRAM), and so on. The nonvolatile memory may include, for example, a read only memory (ROM), a NOR flash memory, a NAND flash memory, a phase change random access memory (PRAM), a resistive random access memory (RRAM), a spin transfer torque random access memory (STTRAM), a magnetic random access memory (MRAM), and so on.

The communication module unit 1150 may include a module capable of being connected with a wired network or a module capable of being connected with a wireless network. The wired network module may include, for example, a local area network (LAN), a universal serial bus (USB), an Ethernet, power line communication (PLC), and so on. The wireless network module may include, for example, Infrared Data Association (IrDA), code division multiple access (CDMA), a time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) and so on.

The memory control unit 1160 may control data communicated between the processor 1100 and an external storage device operating according to a different communication standard. The memory control unit 1160 may include, for example, a memory controller, for example, a controller for controlling IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted from the external input device, and may output the processed data to the external interface device to be communicated as an image, a voice, or in another format. The media processing unit 1170 may include, for example, a graphic processing unit (GPU), a digital signal processor (DSP), a high definition audio (HD audio), a high definition multimedia interface (HDMI) controller, and so on.

Figure 8:
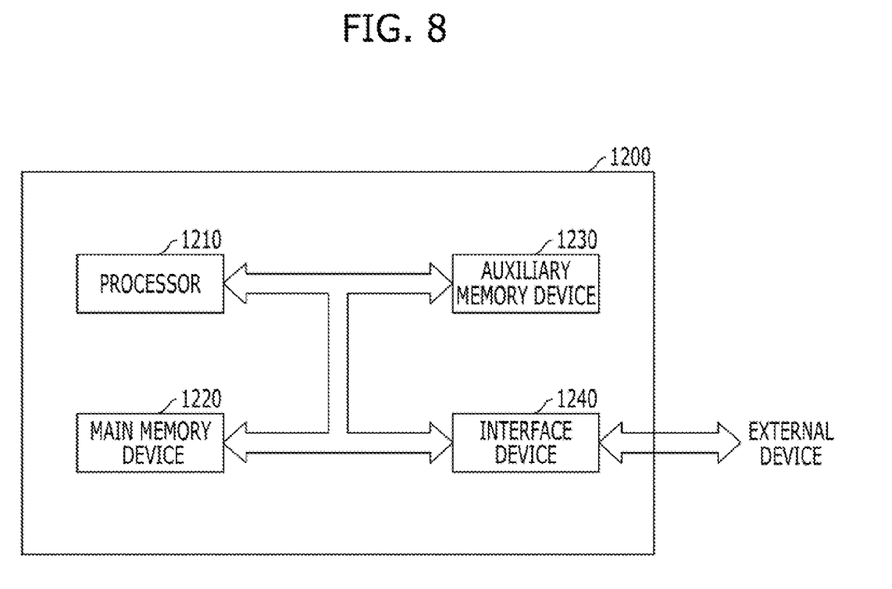
FIG. 8 is a configuration diagram of a system in accordance with an exemplary implementation.

FIG. 8 is a configuration diagram of a system in accordance with an exemplary implementation.

Referring to FIG. 8, a data processing system 1200 to, for example, input, process, output, communicate, or store data. The data processing system 1200 may include a processor 1210, a main in memory device 1220, an auxiliary memory device 1230, or an interface device 1240. The data processing system 1200, of the exemplary implementation, may include an electronic system that operates using processors. Such an electronic system may include, for example, a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may control decoding of inputted commands and processing the data stored in the system 1200, such as operation, comparison, etc. for the data stored in the system 1200. The processor 1210 may include, for example, a microprocessor unit (MPU), a central processing unit (CPU), a single/multi-core processor, a graphic processing unit (GPU), an application processor (AP), a digital signal processor (DSP), and so on.

The main memory device 1220 is a memory that may call and execute programs or data from the auxiliary memory device 1230, when programs are executed, and can conserve memorized contents even if a power supply is cut off. The main memory device 1220 may further include, for example, a volatile static random access memory (SRAM) or a volatile dynamic random access memory (DRAM), in which all contents are erased when power supply is cut off.

The auxiliary memory device 1230 that may store program codes or data. While a speed of the auxiliary memory device 1230 is slower than a speed of the main memory device 1220, the auxiliary memory device 1230 may store a larger amount of data. The auxiliary memory device 1230 may further include, for example, a data storage system, such as a magnetic tape, a magnetic disk, a laser disk, a magneto-optical disc, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

At least one of the processor 1210, the main memory device 1220, and the auxiliary memory device 1230 may include one of the above-described exemplary spin transistors. At least one of the processor 1210, the main memory device 1220, and the auxiliary memory device 1230 including the spin transistors in accordance with the aforementioned exemplary implementation may include a source electrode which is disposed in a substrate (not shown) and includes magnetic materials, a drain electrode which is disposed in the substrate (not shown), spaced apart from the source electrode toward a first direction, and includes magnetic materials, a gate electrode which is interposed between the source electrode and the drain electrode, and protrudes from the substrate (not shown) toward a second direction crossing the first direction, and a channel layer which extends along the gate electrode, and is coupled to the source electrode and the drain electrode.

The interface device 1240 may exchange commands or data between the data processing system 1200, of an exemplary implementation, and an external device. The interface device 1240 may include, for example, a keypad, a keyboard, a mouse a speaker, a mike, a display, various human interface devices (HIDs), or a communication device. The communication device may include, for example, a module capable of being connected with a wired network or a module capable of being connected with a wireless network. The wired network module may include, for example, a local area network (LAN), a universal serial bus (USB), an Ethernet, power line communication (PLC), and so on. The wireless network module may include, for example, Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), and so on.

Figure 9:
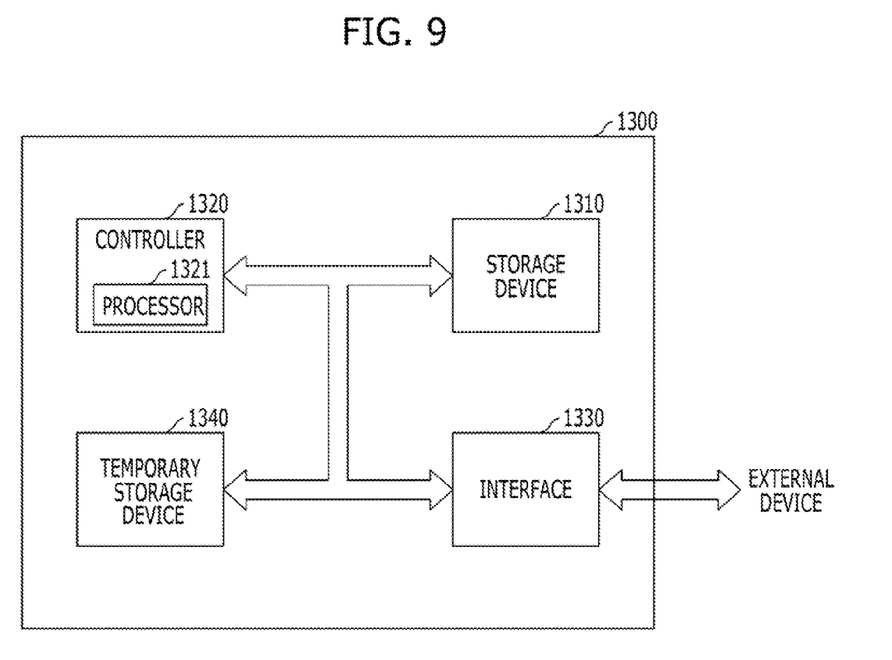
FIG. 9 is a configuration diagram of a data storage system in accordance with an exemplary implementation.

FIG. 9 is a configuration diagram of a data storage system in accordance with an exemplary implementation.

Referring to FIG. 9, a data storage system 1300 may include a non-volatile storage device 1310 to store data, a controller 1320 to control the storage device 1310, or an interface 1330 to connect with an external device. The data storage system 1300 may include, for example, a disk-type storage, such as a hard disk drive (HDD), a compact disc read only memory (CDROM), a digital versatile disc (DVD), a solid state disk (SSD), or a card-type storage, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The controller 1320 may control an exchange of data between the storage device 1310 and the interface 1330. To this end, the controller 1320 may include a processor 1321 for performing an operation or for processing commands inputted through the interface 1330 from an outside of the data storage system 1300.

The interface 1330 is to exchange commands or data between the data storage system 1300 and the external device. If the data storage system 1300 is a card-type storage, then the interface 1330 may be an interface that is compatible with, for example, a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. If the data storage system 1300 is a disk-type storage, then the interface 1330 may be an interface that is compatible with, for example, IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on.

The data storage system 1300, according to an exemplary implementation, may further include a temporary storage device 1340 for efficiently transferring data between the interface 1330 and the storage device 1310 according to diversification and high performance of an interface with an external device, a controller and a system.

At least one of the storage device 1310, the he controller 1320, and the temporary storage device 1340 may include one of the above-described exemplary spin transistors in accordance with the exemplary implementations. At least one of the storage device 1310, the he controller 1320, and the temporary storage device 1340 including the spin transistors in accordance with the aforementioned exemplary implementation may include a source electrode which is disposed in a substrate (not shown) and includes magnetic materials, a drain electrode which is disposed in the substrate (not shown), spaced apart from the source electrode toward a first direction, and includes magnetic materials, a gate electrode which is interposed between the source electrode and the drain electrode, and protrudes from the substrate (not shown) toward a second direction crossing the first direction, and a channel layer which extends along the gate electrode, and is coupled to the source electrode and the drain electrode.

Figure 10:
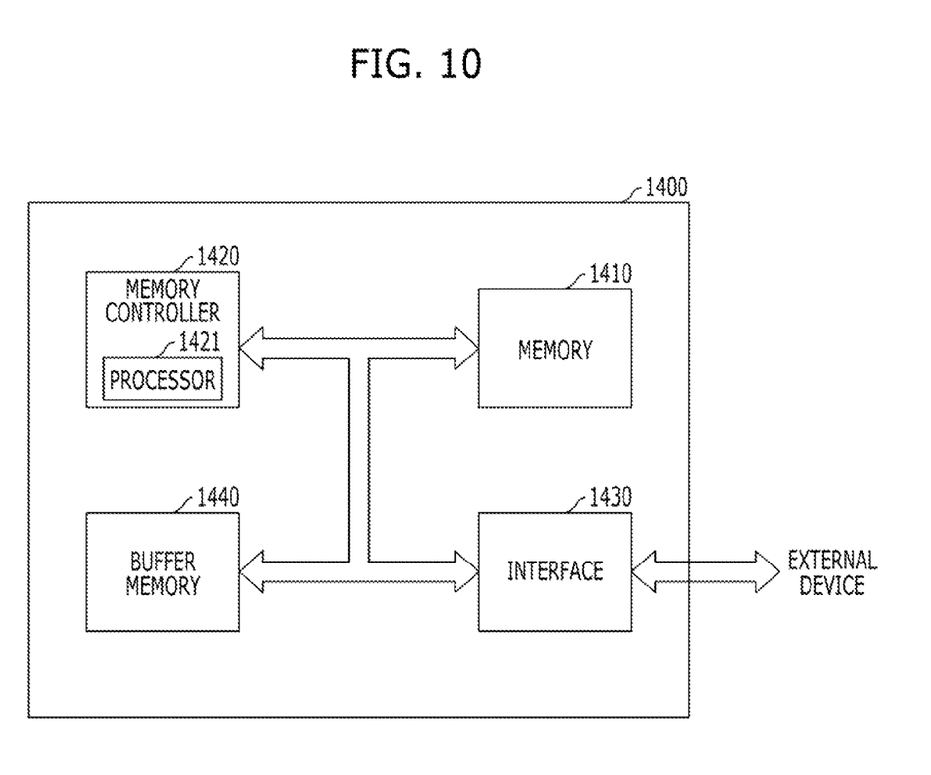
FIG. 10 is a configuration diagram of a memory system in accordance with an exemplary implementation.

FIG. 10 is a configuration diagram of a memory system in accordance with an exemplary implementation.

Referring to FIG. 10, a memory system 1400 may include a non-volatile memory 1410, a memory controller 1420 which controls the memory 1410, and an interface 1430 to connect with an external device. The memory system 1400 may be a card-type, such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

Also, the memory 1410, according to an exemplary implementation, may include a non-volatile memory, such as a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control an exchange of data between the memory 1410 and the interface 1430. To this end, the memory controller 1420 may include a processor 1421 for performing an operation or for processing commands inputted through the interface 1430 from an outside of the memory system 1400.

The interface 1430 may exchange commands or data between the memory system 1400 and the external device. The interface 1430 may be compatible with, for example, a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card and so on.

The memory system 1400, according to an exemplary implementation, may further include a buffer memory 1440 for efficiently transferring data between the interface 1430 and the memory 1410 according to diversification and high performance of an interface with an external device, a memory controller and a memory system.

Moreover the buffer memory 1440, according to an exemplary implementation, may further include a volatile memory, such as a SRAM (static random access memory), or a DRAM (dynamic random access memory), or a non-volatile memory, such as a phase change random access memory (PRAM), a resistive random access memory (RRAM), a spin transfer torque random access memory (STTRAM), a magnetic random access memory (MRAM), and so on, which have a nonvolatile characteristic.

At least one of the memory 1410, the memory controller 1420, and the buffer memory 1440 may include one of the above-described exemplary spin transistors in accordance with the exemplary implementations. At least one of the memory 1410, the memory controller 1420, and the buffer memory 1440 including the spin transistors in accordance with the aforementioned exemplary implementation may include a source electrode which is disposed in a substrate (not shown) and includes magnetic materials, a drain electrode which is disposed in the substrate (not shown), spaced apart from the source electrode toward a first direction, and includes magnetic materials, a gate electrode which is interposed between the source electrode and the drain electrode, and protrudes from the substrate (not shown) toward a second direction crossing the first direction, and a channel layer which extends along the gate electrode, and is coupled to the source electrode and the drain electrode.

As is apparent from the above descriptions, in the spin transistor in accordance with the exemplary implementations, a switching characteristic may be improved by securing a length of a channel layer in which electron is sufficient to perform a spin precession while reducing a size thereof.

Although various exemplary implementations have been described for illustrative purposes, it will be apparent to those skilled in the art that various changes and modifications may be made without departing from the spirit and scope of the invention as defined in the following claims.

What is claimed is:

1. A spin transistor comprising:
   a source electrode, including a magnetic material;
   a drain electrode, including a magnetic material, the drain being spaced apart from the source electrode in a first direction;
   a gate electrode having a buried portion arranged between the source electrode and the drain electrode and a protruding portion arranged over the buried portion, and extending in a second direction substantially perpendicular to the first direction; and
   a channel layer extending along the buried portion of the gate electrode to have an arch shape, and connecting to the source electrode and the drain electrode.

2. The spin transistor according to claim 1, wherein the channel layer is formed over an upper surface of the gate electrode.

3. The spin transistor according to claim 1, wherein the channel layer includes a two-dimensional electron gas layer.

4. The spin transistor according to claim 3, further comprising:
   a cladding layer surrounding the channel layer.

5. The spin transistor according to claim 3, wherein the two-dimensional electron gas layer comprises at least one selected from the group consisting of gallium arsenide (GaAs), indium arsenide (InAs), indium gallium arsenide (InGaAs), and indium antimonide (InSb).

6. The spin transistor according to claim 1, wherein the channel layer includes a magnetic material.

7. The spin transistor according to claim 1, further comprising:
   a tunnel barrier layer interposed between the source electrode and the channel layer, and between the drain electrode and the channel layer.

8. The spin transistor according to claim 1, further comprising:

a dielectric layer interposed between the source electrode and the gate electrode, and between the drain electrode and the gate electrode.

9. The spin transistor according to claim 8, wherein the dielectric layer is further interposed between the channel layer and the gate electrode.

10. The spin transistor according to claim 1, wherein the source electrode or the drain electrode comprises an antiferromagnetic layer and a ferromagnetic layer.

11. The spin transistor according to claim 1, wherein the source electrode or the drain electrode is magnetized in the first direction, or in a direction opposite to the first direction.

12. The spin transistor according to claim 1, wherein the source electrode or the drain electrode is magnetized in the second direction, or in a direction opposite to the second direction.

13. The spin transistor according to claim 1, wherein the source electrode injects spin-polarized electrons into the channel layer, and the drain electrode detects a spin of the electrons passing through the channel layer.

14. The spin transistor according to claim 1, wherein the gate electrode controls a spin direction of electrons passing through the channel layer.

15. The spin transistor according to claim 1, wherein the channel layer has a length that is longer than a distance between the source electrode and the drain electrode.

16. A semiconductor device comprising:
a switching device connected between a first terminal and a second terminal to electrically couple/separate the first terminal to/from the second terminal,
wherein the switching device comprises:
a source electrode, including a magnetic material;
a drain electrode, including a magnetic material, the drain being spaced apart from the source electrode in a first direction;
a gate electrode having a buried portion arranged between the source electrode and the drain electrode and a protruding portion arranged over the buried portion, and extending in a second direction substantially perpendicular to the first direction; and
a channel layer extending along the buried portion of the gate electrode to have an arch shape, and connecting to the source electrode and the drain electrode.

17. A memory device comprising:
a source electrode, including a magnetic material;
a drain electrode, including a magnetic material, the drain being spaced apart from the source electrode in a first direction;
a gate electrode having a buried portion arranged between the source electrode and the drain electrode and a protruding portion arranged over the buried portion, and extending in a second direction substantially perpendicular to the first direction; and
a channel layer extending along the buried portion of the gate electrode to have an arch shape, and connecting to the source electrode and the drain electrode;
a source line electrically connected to the source electrode;
a memory element electrically connected to the drain electrode; and
a bit line electrically connected to the memory element.

* * * * *